United States Patent [19]

Nagashima et al.

[11] Patent Number: 4,968,584
[45] Date of Patent: Nov. 6, 1990

[54] METHOD FOR MAKING LITHOGRAPHIC PRINTING PLATE

[75] Inventors: Akira Nagashima; Hiroshi Matsumoto, both of Shizuoka, Japan

[73] Assignee: Fuji Photo Film Co., Ltd., Minami-ashigara, Japan

[21] Appl. No.: 329,677

[22] Filed: Mar. 28, 1989

[30] Foreign Application Priority Data

Mar. 28, 1988 [JP] Japan ................... 63-73948

[51] Int. Cl.$^5$ .............................. G03F 7/00
[52] U.S. Cl. ................... 430/309; 430/331; 101/463.1; 101/466
[58] Field of Search ............ 430/309, 310, 331, 101, 430/463.1; 101/463.1, 466

[56] References Cited

U.S. PATENT DOCUMENTS

| | | | |
|---|---|---|---|
| 4,063,507 | 12/1977 | Toyama et al. | 430/302 |
| 4,191,570 | 3/1980 | Herting et al. | 430/302 |
| 4,294,910 | 10/1981 | Wielinga | 430/302 |
| 4,762,771 | 8/1988 | Matsumoto et al. | 430/302 |
| 4,786,581 | 11/1988 | Stahlhofen et al. | 430/331 |

FOREIGN PATENT DOCUMENTS 1084758  9/1980  Canada ................... 430/302

Primary Examiner—Jose Dees
Assistant Examiner—J. Weddington
Attorney, Agent, or Firm—Burns, Doane, Swecker & Mathis

[57] ABSTRACT

A method for making lithographic printing plates which comprises imagewise exposing a presensitized plate for use in making lithographic printing plates to light, then developing and thereafter subjecting the developed plate to burning-in pretreatment, the method characterized in that the burning-in pretreatment is performed after applying, to the developed plate, an aqueous solution containing at least one organic solvent whose solubility in water at 25° C. is not less than 0.5% by weight and whose surface tension measured on 0.5% by weight distilled water solution at 25° C. is not more than 65 dyn/cm. The method can provide lithographic printing plates free of greasing, ink spreading on half-dot image portions, in particular shadow portions and excellent in ink receptivity of image areas. In addition, the method can be automated by making use of a spray-circulation type processing apparatus.

12 Claims, No Drawings

METHOD FOR MAKING LITHOGRAPHIC PRINTING PLATE

BACKGROUND OF THE INVENTION

The present invention relates to a method for making lithographic printing plates from presensitized plates for making the same (hereunder referred to as "PS plate(s)") and more particularly to a method for making lithographic printing plates by imagewise exposing a PS plate, whose substrate is made of a metal, to light, developing the exposed PS plate and then subjecting it to burning-in treatment; and a solution for the burning-in pretreatment.

Lithographic printing technique makes the best use of the properties of water and an oil such that they are essentially incompatible with one another. The printing surface thereof comprises areas which receive water and repel an oil ink and those which repel water and receive an oil ink, the former being non-image areas and the latter being image areas. Therefore, light-sensitive compositions used to obtain lithographic printing plates should have properties such that after the formation of images, they repel water while they receive an oil ink.

The light-sensitive compositions used to form lithographic printing plates are divided into two groups, i.e., positive-working and negative-working type ones. Widely used positive-working light-sensitive compositions are composed of o-quinonediazide compounds.

Positive-working PS plates in general comprise a substrate of a metal or a plastic to which an o-quinonediazide compound alone or combined with an alkali-soluble resin such as a novolak type phenol resin or a cresol resin is applied. When such a light-sensitive layer is exposed to an actinic radiation through a positive transparency, the o-quinonediazide compound existing at the exposed portions thereof is decomposed and made alkali-soluble. Therefore, such PS plates can easily be developed with an alkaline aqueous solution to provide positive images. In this case, if a substrate having a hydrophilic surface is employed, a part of the hydrophilic surface from which the light-sensitive layer is removed by an alkaline aqueous solution is revealed to form a non-image area and the exposed portions receive water and repel ink. On the contrary, the remaining portions serving as image portions are oleophilic and thus receive ink.

On the other hand, most of the negative working light-sensitive compositions comprise diazonium salts, azide compounds or photopolymerizable compounds. Such a negative working light-sensitive composition which is used alone or in combination with such an additive as a resin binder is applied to the surface of a substrate. If a substrate having hydrophilic surfaces is utilized to form a light-sensitive composition, the light-sensitive compositions in unexposed portions of the layer formed therefrom are removed with a developer to expose the hydrophilic surface of the substrate, which receive water and repel ink. On the contrary, the remaining portions serving as images after development are oleophilic and receive ink.

If the lithographic printing plate thus obtained is set up on an offset printing press to perform printing operation, beautiful printed matters are provided. The lithographic printing plate produced from such a PS plate can provide several tens of thousands of printed matters if materials for substrate and the composition of the light-sensitive layer applied thereon are appropriately selected. In particular, beautiful printed matters as much as a hundred thousands can be obtained if an aluminum plate which has been grained and then anodized is adopted as a substrate therefor.

Nevertheless, it is required to develop a further improved printing plate capable of providing much more greater number of printed matters. One effective method complying with such a requirement comprises exposing a PS plate whose substrate is made of a metal such as aluminum or zinc to light, developing it and then heating it at an elevated temperature (so-called burning-in treatment) to strengthen the image portions thereof. The burning-in treatment makes it possible to increase the number of printed matters obtained from only one lithographic printing plate as much as several times greater than that achieved by printing plates which are not subjected to a such burning-in treatment.

Moreover, if printing is carried out using a special ink such as ultraviolet-curable ink or low temperature drying ink containing a variety of components which possibly causes dissolution of the images on the printing plate, the image portions are extremely dissolved out when the printing plate is not subjected to burning-in treatment and the number of printed matters acceptable is substantially lowered compared with that obtained when a common ink is used. On the contrary, if the printing plate is subjected to burning-in treatment, the resistance of the image areas to solvent is substantially enhanced and, therefore, sufficient number of printed matters can be obtained even if the aforesaid special ink is used.

However, the hydrophilicity of the non-image areas (i.e., portions at which the hydrophilic surface of the substrate is exposed through development) of the printing plate is impaired due to the burning-in treatment and is converted to ink-receptive one. This results in background contamination on printed matters. When the heating is performed so that such background contamination can be prevented, satisfactory burning-in effect cannot be achieved and hence enhancement of images cannot also be achieved. Therefore, it is required to necessarily carry out counter-etching of the surface of the plate for preventing the contamination of non-image areas resulting from such burning-in treatment. There have been proposed a variety of such counter-etching of the surface performed before and/or after the burning-in treatment.

For instance, contaminations caused due to the burning-in treatment are cleaned thereafter and a processing solution for recovering hydrophilicity of the non-image areas, such an aqueous solution of a fluoride as those containing hydrofluoric acid, borofluoric acid, hydrosilicofluoric acid is applied to the non-image areas. However, these fluorides are toxic substances or violent poisons and, therefore, a problem concerning environmental pollution arises.

Moreover, the counter-etching causes corrosion of the metal surface of the substrate, the surface is in turn easily scratched and shows low wear resistance. As a result, the surface loses its property for receiving water on the non-image areas during printing operation (i.e., water retention), background contamination is caused and thus the plate cannot stand further printing.

In addition, Japanese Patent Un-examined Publication (hereunder referred to as "J.P. KOKAI") No. 51-34001 discloses a method for preventing the lowering of the hydrophilicity of non-image areas prior to such a burning-in treatment, the method comprising treating a plate with an aqueous solution of a salt of organic sulfonic acid such as sodium alkylnaphthalenesulfonate, sodium alkyl diphenyl ether sulfonate or lithium nitrate, prior to the burning-in treatment. Among these, the aqueous solution of a salt of an organic sulfonic acid such as sodium alkylnaphthalenesulfonate or sodium alkyl diphenyl ether sulfonate is highly foamy and thus is not applicable to a spray-circulation type processing apparatus presently used widely. This makes it difficult to automate the plate making operations. Moreover, if the plate is treated with an aqueous solution containing lithium nitrate and then subjected to burning-in treatment, it is not possible to sufficiently prevent occurrence of background contamination.

On the other hand, Japanese Patent Publication for Opposition Purpose (hereunder referred to as "J.P. KOKOKU") No. 55-28062 (U.S. Pat. No. 4,063,507) discloses a method for treating the plate with an aqueous solution containing boric acid capable of causing sublimation and a salt thereof and then subjecting it to burning-in treratment in the presence of such compounds. However, this method cannot completely prevent background contamination. In particular, background contamination is likely caused depending on conditions under which subsequent processings such as water washing and gumming are conducted. For instance, insufficient washing with water and the use of desensitizing gumming solution having low hydrophilization power such as a dextrin type gumming solution easily cause background contamination.

In addition, J.P. KOKAI No. 52-6205 (Canadian Patent No. 1,084,758) discloses a method for treating a plate, prior to a burning-in treatment, with an aqueous solution of a water-soluble organic substance such as gum arabic, cellulose ether or polyacrylic acid and/or an aqueous solution of a water-soluble inorganic salt such as a borate, a phosphate, a sulfate or a halide of alkali metals or alkaline earth metals. However, the method cannot necessarily prevent background contamination completely and in particular if an aqueous solution of a water-soluble polymer such as gum arabic or polyacrylic acid is used, ink receptivity of the resultant image areas during printing is often reduced, in other words the image areas cause image blinding.

J.P. KOKAI No. 57-52057 (U.S. Pat. No. 4,355,096) discloses a method for treating a plate, prior to a burning-in treatment, with an aqueous solution containing an amine having carboxyl group(s) such as ethylenediamine-tetraacetic acid or hydroxyalkyl ethylenediaminetriacetic acid or a salt thereof. However, background contamination inhibitory effect attained by this method is likewise insufficient.

Referring to contamination of half-dot image portions, particularly in the shadow tones (hereunder referred to as "ink spreading"), it is found that if a plate is treated with an aqueous solution containing a surfactant such as a salt of an organic sulfonic acid prior to a burning-in treatment, contamination is not observed while if it is treated with an aqueous solution free of such a surfactant, such portions are likely to cause contamination. As already discussed above, however, the aqueous solution containing a surfactant is very foamy and thus is not applicable to a spray-circulation type processing apparatus presently used widely. This makes it difficult to automate plate making operations.

SUMMARY OF THE INVENTION

Accordingly, an object of the present invention is to provide an improved method for making lithographic printing plates including a burning-in treatment. More specifically, the object of the present invention is to provide a method for making lithographic printing plates including a burning-in treatment which can provide lithographic printing plates free of background contamination, ink spreading on half-dot image portions, in particular shadow portions and excellent in ink receptivity of image areas.

Another object of the present invention is to provide a method for making lithographic printing plates including a burning-in treatment, which can be automated by making use of a spray-circulation type processing apparatus.

A further object of the present invention is to provide a processing solution for burning-in pretreatment, which can be used in the foregoing method.

The inventors of this invention have performed various studies and have found that the foregoing objects of the present invention can effectively be achieved by providing a method for making lithographic printing plates in which a PS plate is imagewise exposed to light, then developed and thereafter subjected the developed plate to burning-in treatment, the method characterized in that the burning-in treatment is performed after applying, to the developed plate, an aqueous solution containing an organic solvent whose solubility in water at 25° C. is not less than 0.5% by weight and whose surface tension measured on 0.5% by weight distilled water solution at 25° C. is not more than 65 dyn/cm.

According to another aspect of the present invention, there is further provided a processing solution for burning-in pretreatment which comprises an aqueous solution containing an organic solvent whose solubility in water at 25° C. is not less than 0.5% by weight and whose surface tension measured on 0.5% by weight distilled water solution at 25° C. is not more than 65 dyn/cm.

DETAILED EXPLANATION OF THE INVENTION

The method and the processing solution of the present invention will hereunder be explained in more detail.

The method of the invention is characterized in that an aqueous solution containing a specific organic solvent capable of reducing the surface tension of water is employed as a processing solution applied to a lithographic printing plate prior to subjecting it to burning-in treatment (hereunder referred to as "solution for burning-in pretreatment"). The reason why ink spreading can be prevented by applying, to the lithographic printing plate prior to the burning-in treatment, an aqueous solution containing such an organic solvent capable of reducing the surface tension of water has not yet been known clearly. However, it seems that the compatibility between the half-dot image areas, in particular the shadow portions and the solution for burning-in pretreatment is improved due to the reduction of the surface tension thereof and hence the solution can be uniformly be applied to the plate.

As compounds which simply reduce surface tension of a solvent, there are known such surfactants as salts of organic sulfonic acids, but as discussed above, such a surfactant is highly foamy. On the contrary, the organic solvents as used herein is clearly distinguished from so-called surfactants since these solvents do not exhibit surface active effect in an aqueous solution and they are organic compounds which are liquid at ordinary temperature. Preferred such organic solvents are those having a boiling point of not less than 100° C. This is because if a boiling point of an organic solvent is less than 100° C., a solution containing such an organic solvent can be uniformly applied to the plate to be processed, but the organic solvent is evaporated earlier than water. Therefore, an insular non-uniform film is formed during burning-in pretreatment and bad smell is severely given out around a coater for applying the solution for burning-in pretreatment.

Such organic solvents are preferably alcohols, more preferably divalent or higher polyvalent alcohols and particularly preferred are products (adducts) obtained by reacting one mole of an alcohol with 1 to 15 moles of ethylene oxide or/and 1 to 15 moles of propylene oxide with the proviso that the total molar amount of ethylene oxide and propylene oxide to be added does not exceed 15 moles. This is because if the total amount of these two compounds exceeds 15 moles, the solution containing the same is likely to cause foaming and thus applicability of the solution to a spray-circulation type processing apparatus is lowered.

The term "alcohol(s)" reacted with ethylene oxide and/or propylene oxide herein means alcohols other than those having a structure derived from ethylene oxide and/or propylene oxide and encompasses ethylene glycol, diethylene glycol, propylene glycol and alkyl ethers and esters thereof.

The organic solvents may be used alone or in combination. In the invention, the amount of the organic solvents is rather critical. The amount thereof to be incorporated into the solution for burning-in pretreatment ranges from 0.5 to 35% by weight and more preferably 2.0 to 10% by weight on the basis of the total weight of the solution for burning-in pretreatment. This is because if it exceeds 35% by weight, ink receptivity of the lithographic printing plate at the beginning of the printing is impaired.

Specific examples of organic solvents which may be used in the invention will hereinafter be listed. In this connection, the numerical values given in the parenthesis means surface tension (dyn/cm) of a solution in distilled water having a concentration of 0.5% by weight at 25° C.

1-butoxy-2-propanol (55); 1-butoxy-2-propanol to which two moles of propylene oxide are added (60); phenyl cellosolve (60); adduct of phenyl cellosolve and three moles of ethylene oxide (63); benzyl alcohol (50); adduct of benzyl alcohol and two moles of ethylene oxide (55); adduct of benzyl alcohol with two moles of ethylene oxide and 4 moles of propylene oxide (60); adduct of propylene glycol and 5 moles of ethylene oxide (60); adduct of furfuryl alcohol and 4 moles of propylene oxide (60); 2-methyl-1,3-hexanediol (40); adduct of 2-methyl-1,3-hexanediol and one mole of ethylene oxide (45); adduct of 2-methyl-1,3-hexanediol and 4 moles of propylene oxide (50); 2-ethyl-1,3-hexanediol (40); adduct of 2-ethyl-1,3-hexanediol and 4 moles of ethylene oxide (50); adduct of 2-ethyl-1,3-hexanediol and 6 moles of propylene oxide (55); and adduct of 2-ethyl-1,3-hexanediol, 8 moles of ethylene oxide and 6 moles of propylene oxide (60).

The solution for burning-in pretreatment may contain a variety of combinations of additives. Examples of such additives are water-soluble inorganic compounds, water-soluble organic compounds and salts thereof and water-soluble polymers. Scumming during a burning-in process can effectively be prevented by using a combination of these additives. Specific examples of water-soluble inorganic compounds include such inorganic acids and metal salts and ammonium salts thereof as magnesium chloride, potassium chloride, potassium bromide, sodium sulfate, sodium sulfite, sodium thiosulfate, magnesium nitrate, monolithium dihydrogen phosphate, phosphoric acid, phosphorous acid, phytic acid, boric acid, ammonium borate, sodium borate, silicic acid, potassium silicate, sodium carbonate, lithium hydroxide, pyrophosphoric acid and magnesium pyrophosphate.

Specific examples of water-soluble organic acids and salts thereof include such sulfonic acid and salts thereof as sulfanilic acid, potassium sulfanilate, methanedisulfonic acid, 1,3-benzenedisulfonic acid and potassium 1,3-benzenedisulfonate; such carboxylic acids and salts thereof as trimellitic acid, benzenecarboxylic acid, acetic acid, citric acid, malic acid, succinic acid, oxalic acid and tartaric acid; and such phosphonic acid and salts thereof as 2-amino-2-methyl-1-hydroxypropane 1,1-diphosphonic acid, 1-hydroxyethane 1,1-diphosphonic acid and sodium 1-hydroxyethane 1,1-diphosphonate (in this respect, salts include, for instance, lithium salts, sodium salts or potassium salts).

Specific examples of water-soluble polymers include such natural polymers as alginates of starches and ammonium salts thereof; such semisynthetic polymers as cyclodextrin, carboxyalkyl starches, starch phosphates and maltodextrin; such synthetic polymers as polymethacrylic acid, polyacrylic acid, polystyrene sulfonic acid, sodium polystyrene sulfonate and polyvinyl phosphonic acid.

In addition to the foregoing components, the solution for burning-in pretreatment may further comprise dyes, antifoaming agents and preservatives.

The wettability of the solution may be improved due to the presence of the foregoing organic solvents. However, if it is intended to further improve the wettability, a surfactant may be additionally used. Some of surfactants exhibit contamination inhibitory effect during burning-in pretreatment. Examples of such surfactants are disulfonic acid salts of alkyl diphenyl ether, sodium alkylnaphthalene sulfonate and a condensate of naphthalenesulfonic acid and formalin.

In the present invention, the solution for burning-in pretreatment is applied, before burning-in pretreatment, to a lithographic printing plate which has been prepared by imagewise exposing a PS plate to light, developing it, optionally washing with water and then removing parts unnecessary for printing with a retouching agent; and further optionally drying the plate and which does not require retouching any more. The solution for burning-in pretreatment may be applied to the surface of the plate by coating it using sponge containing the solution; by dipping the plate in a batt filled with the solution or by applying it with an automatic coater. In this respect, the applied solution on the plate is preferably leveled using a squeezy or squeezy rollers after the application thereof. This process would provide more preferred results.

In general, the amount of the solution for burning-in pretreatment to be applied to the plate suitably ranges from 0.03 to 0. 8 g/m$^2$ (weighted after drying).

The lithographic printing plate to which the solution for burning-in pretreatment is applied is optionally dried and then heated to an elevated temperature in a burning-in processor, for instance, Burning-in Processor (available from Fuji Photo Film Co., Ltd.). In this respect, the temperature and the time for the burning-in pretreatment may vary depending on the kinds of components which form images, but preferably the burning-in pretreatment is performed at a temperature ranging from 180° to 300° C. for 1 to 20 minutes.

The lithographic printing plate which have been subjected to burning-in pretreatment may be processed according to conventionally known processes such as water washing and/or gumming processes according to need. However, if the solution for burning-in pretreatment contains a water-soluble polymer, so-called desensitization treatment such as gumming-up process may be omitted.

The method for making lithographic printing plates can be applied to a variety of PS plates and in particular to the PS plates whose substrate is made of aluminum plate. Preferred examples of such PS plates include PS plates comprising an aluminum substrate provided thereon with a light-sensitive layer composed of a mixture of a diazo resin, which is a salt of a condensate of p-diazodiphenylamine and paraformaldehyde, and schellac as disclosed in U.K. Patent No. 1,350,521; negative working PS plates such as those comprising an aluminum substrate provided thereon with a light-sensitive layer composed of a mixture of a diazo resin and a polymer having, as principal repeating units, those derived from hydroxyethyl methacrylate or hydroxyethyl acrylate as disclosed in U.K. Patent Nos. 1,460,978 and 1,505,739; and positive working PS plates such as those comprising an aluminum substrate provided thereon with a light-sensitive layer composed of a mixture of o-quinonediazide light-sensitive substance and a novolak type phenol resin as disclosed in J.P. KOKAI No. 50-125806 (U.S. Pat. No. 4,123,279). Other preferred examples of PS plates are those comprising an aluminum substrate provided thereon with a light-sensitive layer composed of photocross-linkable photopolymer such as those specifically disclosed in U.S. Pat. No. 3,860,426; those comprising an aluminum substrate provided thereon with a light-sensitive layer consisting of a composition of photopolymerizable photopolymer as disclosed in U.S. Pat. Nos. 4,072,528, 4,072,527 and 4,687,727; and those comprising an aluminum substrate provided thereon with a light-sensitive layer consisting of an azide and a water-soluble polymer as disclosed in U.K. Patent Nos. 1,235,281 and 1,495,861. Among these PS plates, particularly preferred are positive working PS plates comprising a light-sensitive layer consisting of an o-naphthoquinonediazide compound and a novolak resin and which are explained in detail in U.S. Pat. No. 4,259,434 (third column, line 2 from the bottom to sixth column, line 14).

When the lithographic printing plate prepared according to the method for making the same of the present invention is set up on an offset printing press to perform printing operation, printed matters free of background contamination on non-image areas and ink spreading of half-dot image portions can be obtained. In addition, the plate shows good ink receptivity such that ink is received on the image portions after printing only several printed matters. Moreover, the lithographic printing plate has high printing durability and thus it can provide good acceptable printed matters several times greater than that obtained by plates which is not subjected to the burning-in pretreatment of the present invention.

Moreover, the solution for burning-in pretreatment used in the method of this invention exhibits low foaming properties. Therefore, PS plates may be processed utilizing a spray-circulation type automatic processing apparatus and such a solution for burning-in pretreatment and thus the plate making operations can be automated.

The method and the solution for burning-in pretreatment of the present invention will hereinafter be explained in more detail with reference to the following non-limitative working Examples and further the effects practically attained by the present invention will also be discussed in detail in comparison with Comparative Examples.

EXAMPLE 1

2 Parts by weight of naphthoquinone-(1,2)-diazido(2)-5-sulfonic acid ester of 1,5-dihydroxynaphthalene and 4 parts by weight of a novolak type cresol-formaldehyde resin were dissolved in 100 parts by weight of ethylene glycol monomethyl ether. The resultant solution was applied to the surface of an aluminum plate which had been grained and has a thickness of 0.24 mm so that the amount thereof coated (weighted after drying) was 2.5 g/m$^2$. The PS plate thus prepared was exposed to light of a 3 KW metal halide lamp disposed at a distance of 1 m, through a positive transparency which was closely brought into contact with the plate for 30 seconds. Then, the plate was developed by dipping it in 5% by weight aqueous solution of sodium silicate for about one minute. After the developed plate was washed with water, a solution for burning-in pretreatment having the following composition was applied thereto and then was dried. The amount of the solution coated was 0.4 g/m$^2$ (weighed after drying).

| Component | Amount (parts by weight) |
| --- | --- |
| Adduct of 2-ethyl-1,3-hexanediol and 6 moles of ethylene oxide | 40 |
| Ammonium borate (($NH_4)_2O.5B_2O_3.8H_2O$)) | 40 |
| Pure water | 980 |

The PS plate thus processed was heated to 260° C. for 6 minutes in a commercially available Burning-in Processor (Burning-in Processor 1300; manufactured and sold by Fuji Photo Film Co., Ltd.).

After cooling the heated plate, it was gummed-up and then set up on an offset printing press to carry out printing operation. Thus, beautiful printed matters were obtained and when the printing operation was continued, there were finally provided 150,000 of beautiful printed matters.

COMPARATIVE EXAMPLE 1

The same procedures as in Example 1 were repeated to obtain a comparative lithographic printing plate except that 4% by weight aqueous solution of ammonium borate (($NH_4)_2O.5B_2O_3.8H_2O$)) was applied to the resulting plate prior to burning-in pretreatment instead of the solution for burning-in pretreatment used in Example 1 so that the amount thereof coated was 0.3 g/m$^2$ (weighed after drying). In this case, the resultant lithographic printing plate caused ink spreading on half-dot images at the shadow portions from the beginning of the printing and thus it was necessary to remove the contamination at the ink spreading portions with a plate cleaner.

EXAMPLE 2

The same light-sensitive composition as used in Example 1 was applied to the surface of an aluminum plate which had been grained and then anodized (the anodization had been performed at a current density of 1.6 A/dm$^2$ for two minutes in 15% by weight solution of sulfuric acid) and which had a thickness of 0.3 mm, to form a positive working PS plate.

The PS plate thus prepared was exposed to light of a 3 KW metal halide lamp disposed at a distance of 1 m, through a positive transparency which was closely brought into contact with the plate for 40 seconds. Then, the plate was developed by dipping it in 7% by weight aqueous solution of sodium silicate for about one minute. The developed plate was then continuously processed with an automatic integrated Burning-in Processor (available from Process Shizai Co., Ltd.; according to this processor, the application of solution for burning-in pretreatment, burning-in treatment and gumming-up are continuously performed and the processor is equipped with a front chamber for heating and a rear chamber for heating). In this processing, the temperature for burning-in was set at 150° C. for the front chamber and 240° C. for the rear chamber and the retention time in the heating chambers was about 3 minutes. Moreover, the solution having the following composition was used as a solution for burning-in pretreatment. The amount of the solution coated was 0.5 g/m$^2$ (weighed after drying).

| Component | Amount (parts by weight) |
| --- | --- |
| Adduct of 2-ethyl-1,3-hexanediol, 4 moles of ethylene oxide and 2 moles of propylene oxide | 60 |
| Phytic acid (50% by weight aqueous solution) | 40 |
| Potassium hydroxide | 18 |
| Pure water | 882 |

The lithographic printing plate thus subjected to burning-in pretreatment was then directly set up on an offset printing press to carry out printing operation. Thus, beautiful printed matters were obtained and when the printing operation was continued, there were finally provided 300,000 of beautiful printed matters.

COMPARATIVE EXAMPLE 2

The same processing as in Example 2 was performed except for using a solution for burning-in pretreatment having the following composition. The amount thereof coated was 0.5 g/m$^2$ (weighed after drying).

| Component | Amount (parts by weight) |
| --- | --- |
| Sodium alkyl diphenyl ether disulfonate | 60 |
| 50% by weight aqueous solution of phytic acid | 40 |
| Potassium hydroxide | 18 |
| Pure water | 882 |

As a result, there was observed an extreme foaming at the spraying pipe and tank portions near the parts for coating the solution for burning-in pretreatment, the solution was flooded from the tank and thus it was innevitable to stop the operation of the automatic processor.

COMPARATIVE EXAMPLE 3

The same processing as in Example 2 was performed except for using a solution for burning-in pretreatment having the following composition. The amount thereof coated was 0.5 g/m$^2$ (weighed after drying).

| Component | Amount (parts by weight) |
| --- | --- |
| Adduct of 2-ethyl-1,3-hexanediol, 12 moles of ethylene oxide and 8 moles of propylene oxide | 60 |
| 50% by weight aqueous solution of phytic acid | 40 |
| Potassium hydroxide | 18 |
| Pure water | 882 |

As a result, there was observed an extreme foaming at the spraying pipe and tank portions near the parts for coating the solution for burning-in pretreatment, the solution was flooded from the tank and thus it was innevitable to stop the operation of the automatic processor.

EXAMPLE 3

The same procedures as in Example 1 were repeated except that a solution having the following composition was employed as a solution for burning-in pretreatment and the same results as observed in Example 1 were obtained. The amount thereof coated was 0.4 g/m$^2$ (weighed after drying).

| Component | Amount (parts by weight) |
| --- | --- |
| Adduct of 2-butoxy-2-propanol and 3 moles of propylene oxide | 80 |
| Boric acid | 30 |
| Pure water | 890 |

EXAMPLE 4

4 Parts by weight of an ester of polyhydroxyphenyl obtained by polycondensing acetone and pyrogallol as disclosed in Example 1 of U.S. Pat. No. 3,365,709 and naphthoquinone-1,2-diazido(2)-5-sulfonic acid and 4 parts by weight of a novolak type cresol-formaldehyde resin were dissolved in 100 parts by weight of ethylene glycol monomethyl ether and the resultant solution was applied to the surface of the aluminum plate used in Example 2 which had been grained and anodized so that the amount thereof coated was 2.5 g/m$^2$ (weighed after drying) to obtain a positive working PS plate.

The PS plate thus obtained was exposed to light, developed and washed with water under the same conditions as in Example 1. Then, a solution for burning-in pretreatment having the following composition was applied to the resulting plate and the plate was subjected to burning-in treatment at 260° C. for 5 minutes. The amount thereof coated was 0.6 g/m$^2$ (weighed after drying).

| Component | Amount (parts by weight) |
| --- | --- |
| Adduct of 2-methyl-1,3-hexanediol and 7 moles of propylene oxide | 30 |
| Sodium 2-acrylamido-2-methylpropane sulfonate/ maleic anhydride (molar ratio = 90/10) | 60 |

-continued

| Component | Amount (parts by weight) |
|---|---|
| copolymer (Mw = 4,000~8,000) | |
| Sulfanilic acid | 20 |
| Malic acid | 20 |
| Lithium hydroxide | 15 |
| Pure water | 855 |

The lithographic printing plate thus subjected to burning-in pretreatment was then directly set up on an offset printing press without carrying out gumming-up process to carry out printing operation. Thus, beautiful printed matters were obtained and when the printing operation was continued, there were finally provided 200,000 of beautiful printed matters.

EXAMPLE 5

The same procedures as in Example 4 were repeated to obtain a lithographic printing plate subjected to burning-in pretreatment except that 15% by weight aqueous solution of an adduct of 2-methyl-1,3-hexanediol and 12 moles of ethylene oxide was used as a solution for burning-in pretreatment and that burning-in pretreatment was carried out at 260° C. for 5 minutes. The amount thereof coated was 0.5 g/m$^2$ (weighed after drying). When the resultant lithographic printing plate was set up on an offset printing machine after gumming-up, beautiful printed matters were obtained after only several printed matters were spoiled and when the printing operation was continued, there were finally provided 200,000 of beautiful printed matters.

COMPARATIVE EXAMPLE 4

The same procedures as in Example 5 were repeated except that water was used instead of the solution for burning-in pretreatment containing an adduct of 2-methyl-1,3-hexanediol and 2 moles of ethylene oxide to obtain a comparative lithographic printing plate. Then, the plate was set up on an offset printing press to carry out printing. However, the plate caused background contamination on non-image areas from the beginning of the printing operation.

EXAMPLE 6

20 Parts by weight of shellac and 3 parts by weight of a diazo resin obtained by condensing p-toluenesulfonic acid salt of p-diazodiphenylamine and formaldehyde were dissolved in 80 parts by weight of dimethylformamide to form a solution. Whereas an aluminum plate which had been grained was dipped in 0.2% aqueous solution of potassium fluorozirconate at 80° C. for 3 minutes to hydrophilize the plate and was dried. Then, the solution prepared above was applied to the surface of the aluminum plate so that the amount thereof coated was 2.0 g/m$^2$ (weighed after drying) to obtain a negative working PS plate.

The PS plate thus prepared was exposed to light of a 3 KW metal halide lamp disposed at a distance of 1 m through a negative transparency for 30 seconds. Then the plate was dipped in 20% by weight aqueous solution of isopropyl alcohol for about one minute and the surface thereof was gently rubbed with absorbent wadding to completely remove only the un-exposed areas of the plate and to thus expose the surface of the substrate to air.

After washing with water, the same solution for burning-in pretreatment as used in Example 1 was applied to the plate, and dried, and the plate was subjected to burning-in pretreatment in the same manner as in Example 1. The coated amount thereof was 0.4 g/m$^2$ (weighed after drying). When the resultant lithographic printing plate was set up on an offset printing press to perform printing, beautiful printed matters were obtained after ten and several printed matters were spoiled and when the printing operation was continued, 150,000 of printed matters which had almost the same tone as that obtained at the beginning of the printing were be obtained.

EXAMPLE 7

An aluminum substrate having a thickness of 0.3 mm was prepared by graining with a nylon brush and a pumice/water slurry, anodizing at a current density of 2 A/dm$^2$ for two minutes in 20% sulfuric acid solution and then treating with 2.5% by weight aqueous solution of sodium silicate maintained at 70° C. for one minute.

A light-sensitive solution having the following composition was applied to the surface of the aluminum plate thus prepared so that the coated amount thereof was 2.0 g/m$^2$ (weighed after drying).

| Component | Amount (g) |
|---|---|
| Copolymer of 2-hydroxyethyl methacrylate/acrylonitrile/ethyl methacrylate/methacrylic acid (weight ratio = 37/34/22/7) | 5.0 |
| Diazo resin obtained by condensing p-toluenesulfonic acid salt of p-diazodiphenylamine and formaldehyde | 0.5 |
| Victoria Pure Blue BHO (available from HODOGAYA CHEMICAL CO., LTD.) | 0.1 |
| Methyl cellosolve | 95 (ml) |
| Pure water | 5 (ml) |

The negative working PS plate thus obtained was exposed to light of a 3 KW metal halide lamp disposed at a distance of 1 m through a negative transparency for 30 seconds and then was developed with a developer having the following composition.

| Component | Amount (g) |
|---|---|
| Benzyl alcohol | 30 (ml) |
| Diethanolamine | 10 |
| Sodium sulfite | 5 |
| Sodium isopropylnaphthalene sulfonate | 10 |
| Water | 1 (l) |

After washing with water, the same solution for burning-in pretreatment as used in Example 2 was applied to the plate (the coated amount thereof was 0.4 g/m$^2$ (weighed after drying)) and then dried. Thereafter, the plate was subjected to burning-in pretreatment in the same manner as in Example 2. When the resultant lithographic printing plate was set up on an offset printing press to perform printing, beautiful printed matters were obtained after several printed matters were spoiled and when the printing operation was continued, 200,000 of printed matters which had almost the same tone as that obtained at the beginning of the printing were obtained.

EXAMPLE 8

A light-sensitive solution having the following composition was applied to the surface of a plate (substrate)

which had been grained, anodized and treated with sodium silicate solution as in Example 7 so that the coated amount thereof was 3.0 g/m² (dry basis) and then was dried at 100° C. for two minutes.

| Component | Amount (g) |
|---|---|
| Copolymer of methyl methacrylate/methacrylic acid (molar ratio = 85/15; intrinsic viscosity = 0.166 measured at 30° C. (methyl ethyl ketone solution)) | 56 |
| Trimethylolpropane triacrylate | 40 |
| 3-Methyl-2-benzoylmethylenenaphtho(1, 2-d)thiazole | 5 |
| Phthalocyanine Blue | 3 |
| Ethylene dichloride | 500 |
| 2-methoxyethyl acetate | 500 |

After drying the plate, 3% by weight aqueous solution of polyvinyl alcohol was applied to the surface of the light-sensitive layer in an amount of 1.5 g/m² (dry basis) and then dried.

The plate thus obtained was exposed to light and was developed in the same manner as in Example 7. After washing with water, the solution for burning-in pretreatment as used in Example 4 was applied thereto in an amount of 0.6 g/m² (weighed after drying) and then the plate was subjected to burning-in treatment under the same conditions as before. When the resultant plate was set up on an offset printing press to perform printing, beautiful printed matters were obtained after several printed matters were spoiled.

What is claimed is:

1. A method for making lithographic printing plates which comprises imagewise exposing a presensitized plate for use in making lithographic printing plates to light, then developing and thereafter subjecting the developed plate to burning-in pretreatment, the burning-in pretreatment being performed after applying, to the developed plate, an aqueous solution containing at least one organic solvent (i) having a boiling point of not less than 100° C., (ii) whose solubility in water at 25° C. is not less than 0.5% by weight, (iii) whose surface tension measured on 0.5% by weight distilled water solution at 25° C. is not more than 65 dyn/cm and (iv) is selected from products obtained by reacting one mole of an alcohol with 1 to 15 moles of ethylene oxide or/and 1 to 15 moles of propylene oxide with the proviso that the total molar amount of ethylene oxide and propylene oxide does not exceed 15 moles.

2. A method of claim 1 wherein the amount of the organic solvent ranges from 0.5 to 35% by weight on the basis of the total weight of the solution for burning-in pretreatment.

3. A method of claim 1 wherein the amount of the organic solvent ranges from 2.0 to 10% by weight on the basis of the total weight of the solution for burning-in pretreatment.

4. A method of claim 1 wherein the amount of the solution for burning-in pretreatment to be coated on the developed plate ranges from 0.03 to 0.8 g/m² expressed in the amount weighed after drying.

5. A method of claim 1 wherein the burning-in pretreatment is performed at a temperature ranging from 180° to 300° C. for 1 to 20 minutes.

6. A method of claim 1 wherein the plate subjected to burning-in pretreatment is further washed with water and/or gummed-up.

7. A method of claim 1 wherein the organic solvent is selected from the group consisting of 1-butoxy-2-propanol; 1-butoxy-2-propanol to which two moles of propylene oxide are added; phenyl cellosolve; adduct of phenyl cellosolve and three moles of ethylene oxide; benzyl alcohol; adduct of benzyl alcohol and two moles of ethylene oxide; adduct of benzyl alcohol with two moles of ethylene oxide and 4 moles of propylene oxide; adduct of propylene glycol and 5 moles of ethylene oxide; adduct of furfuryl alcohol and 4 moles of propylene oxide; 2-methyl-1,3-hexanediol; adduct of 2-methyl-1,3-hexanediol and one mole of ethylene oxide; adduct of 2-methyl-1,3-hexanediol and one mole of ethylene oxide; adduct of 2-methyl-1,3-hexanediol and 4 moles of propylene oxide; 2-ethyl-1,3-hexanediol; adduct of 2-ethyl-1,3-hexanediol and 4 moles of ethylene oxide; adduct of 2-ethyl-1,3-hexanediol and 6 moles of propylene oxide; and adduct of 2-ethyl-1,3-hexanediol, 8 moles of ethylene oxide and 6 moles of propylene oxide.

8. A method of claim 1 wherein the solution for burning-in pretreatment further comprises at least one compound selected from the group consisting of water-soluble inorganic acids, water-soluble organic acids, metal salts and ammonium salts of the above acids, and a water soluble polymer.

9. A method of claim 8 wherein the water-soluble inorganic acid and the metal salts and ammonium salts thereof are selected from the group consisting of magnesium chloride, potassium chloride, potassium bromide, sodium sulfate, sodium sulfite, sodium thiosulfate, magnesium nitrate, monolithium dihydrogen phosphate, phosphoric acid, phosphorous acid, phytic acid, boric acid, ammonium borate, sodium borate, silicic acid, potassium silicate, sodium carbonate, lithium hydroxide, pyrophosphoric acid and magnesium pyrophosphate.

10. A method of claim 8 wherein the water-soluble organic acid is selected from the group consisting of sulfanilic acid, methanedisulfonic acid, 1,3-benzenedisulfonic acid, trimellitic acid, benzenecarboxylic acid, acetic acid, citric acid, malic acid, succinic acid, oxalic acid, tartaric acid, 2-amino-2-methyl-1-hydroxypropane 1,1-diphosphonic acid and 1-hydroxyethane 1,1-diphosphonic acid.

11. A method of claim 1 wherein the solution for burning-in pretreatment further comprises a surfactant.

12. A method of claim 11 wherein the surfactant is selected from the group consisting of disulfonic acid salts of alkyl diphenyl ether, sodium alkylnaphthalene sulfonate and a condensate of naphthalenesulfonic acid and formalin.

* * * * *